United States Patent [19]
Page

[11] Patent Number: 5,058,083
[45] Date of Patent: Oct. 15, 1991

[54] FLEXDUCER PREAMPLIFIER POWER CONTROLLER

[75] Inventor: Robert E. Page, San Diego, Calif.

[73] Assignee: The United States of America as represented by the Secretary of the Navy, Washington, D.C.

[21] Appl. No.: 624,362

[22] Filed: Dec. 7, 1990

[51] Int. Cl.⁵ .............................................. H04B 1/02
[52] U.S. Cl. ..................................... 367/137; 367/900; 367/903
[58] Field of Search ........................ 367/137, 903, 900

[56] References Cited

U.S. PATENT DOCUMENTS

| | | | |
|---|---|---|---|
| 913,372 | 2/1909 | Gardner | 367/141 |
| 3,567,961 | 3/1971 | Koechner | 307/517 |
| 3,939,465 | 2/1976 | Helton et al. | 367/137 |
| 4,282,452 | 8/1981 | Hassler et al. | 367/137 |
| 4,333,347 | 6/1982 | Lang et al. | 367/137 |
| 4,841,497 | 6/1989 | Bateman et al. | 368/113 |

*Primary Examiner*—Daniel T. Pihulic
*Attorney, Agent, or Firm*—Harvey Fendelman; Thomas Glenn Keough

[57] ABSTRACT

Linear and switching amplifiers associated with acoustic transducers require a gradual turn-on rather than an abrupt full-power level signal. A transducer preamplifier power controller circuit prevents the operation of fuses and the tripping of circuit breakers when the relatively high power driving levels for a sonar transducer are initiated. The controller circuit gradually increases a signal level from a zero level to a maximum during the initiation of a sonar signal using a threshold level that is set to a fraction of the expected maximum, and two discrete clock frequencies, for example at 1 MHz and 2 KHz actuate interconnected digital control elements incrementally to increase the signal level during a predetermined period. This cycle is re-initiated by the next sonar signal.

10 Claims, 4 Drawing Sheets

FLEXDUCER PREAMPLIFIER POWER CONTROLLER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Sonar transducers operating in the active mode require high levels of driving energy to be effective for most applications. Care must be taken, however, not to overly drive the transducers initially since the linear and switching types of amplifiers associated with the transducers may be damaged by too abrupt initiation signals. Associated circuits designed to protect the amplifiers have included fuses and circuit breakers which would protect their interconnected components from damage due to the high driving levels. The blowing fuses and tripping circuit breakers, while providing for protection, are disruptive under some operating conditions and, during others, could compromise a much-needed sonar capability.

Thus, a continuing need exists in the state of the art for a transducer preamplifier power controller circuit that assures protection of the associated components yet does not compromise the operational potentials of the sonar system.

SUMMARY OF THE INVENTION

The present invention is directed to providing a power controller circuit for gradually increasing an actuation signal to a full level signal to avoid creating excessive driving signals. A comparator circuit is adapted to compare the actuation signal with a predetermined threshold level to provide a RUN signal whenever the actuation signal is present. A flip-flop circuit is connected to receive the RUN signal from the comparator circuit to generate a START signal and a period counter circuit appropriately fabricated to create a predetermined amount of incrementing is connected to receive the START signal from the flip-flop circuit signals. A digital gain set circuit interconnected to receive the actuation signal and connected to the period counter circuit receives the predetermined amount of incrementing output signals to digitally control the gain of the actuation signal with an OUT signal in accordance with the accumulation of the predetermined amount of incrementing output signals to enable the gradual increase of the actuation signal to the full level signal. A decoder circuit suitably coupled to the period counter circuit inhibits the predetermined amount of incrementing output signals when it corresponds to the magnitude of the full level signal throughout the duration of the actuation signal. A reset counter circuit interconnected to said comparator circuit and said flip-flop circuit resets the flip-flop circuit with a STOP signal in the absence of the RUN signal from the comparator circuit. A voltage follower circuit coupled to the digital gain circuit amplifies the actuation signal to the magnitude of the full level signal in accordance with the OUT signal from the digital gain set circuit.

An object of the invention is to prevent the damage of associated components from a too rapid built-up of a driving signal.

Another object is to protect active sonar elements from an initiating sonar signal.

Another object is to provide a controller circuit for associated circuitry which prevents fuse operating and the tripping of circuit breakers during startup.

Yet another object is to provide for a controller circuit adapted to accommodate repetitive driving signals so as to prevent damage to interconnected circuit components.

These and other objects of the invention will become more readily apparent from the ensuing specification and claims when taken in conjunction with the attached drawings.

DESCRIPTION OF THE PREFERRED EMBODIMENT

Figure 1:
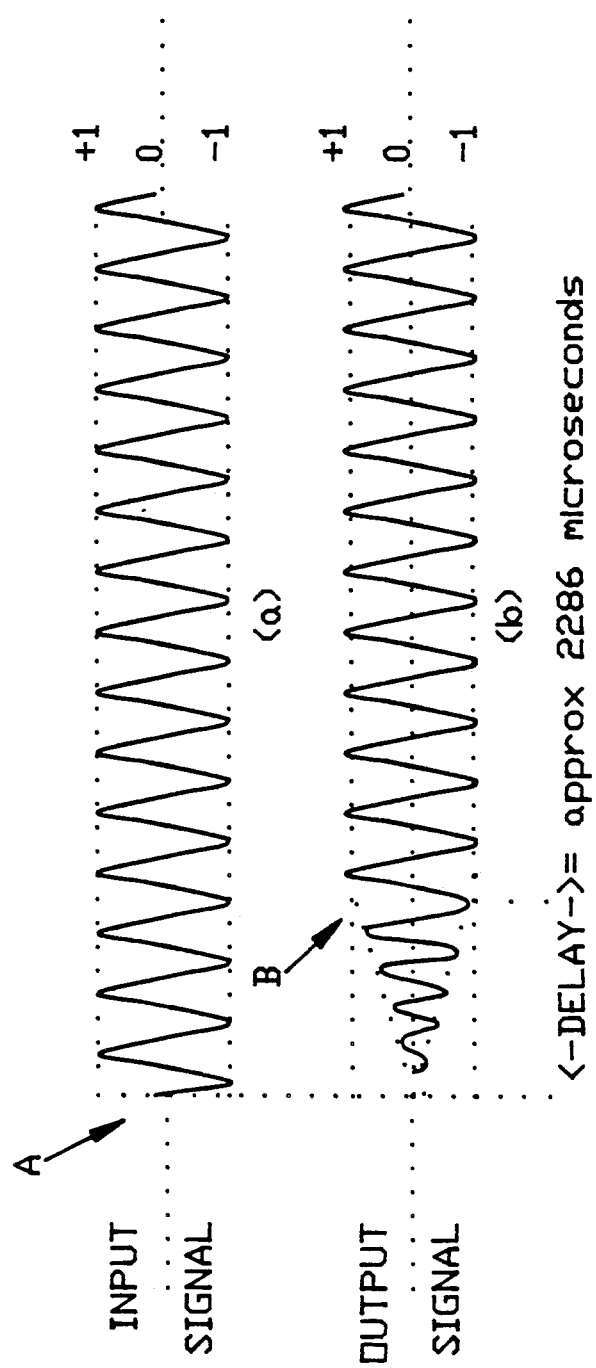
FIG. 1 depicts input and output signals from the power controller showing a gradual turn-on delay.

Referring now to FIG. 1 of the drawings, a typical input signal A for an active sonar or, for example, the driving signal for a wide variety of associated electronic components that may be used to increase an output power level is shown as the input signal in FIG. 1(a). The relatively abrupt transition from zero to the normalized levels of $-1$ and $+1$ have demonstrated a likelihood to at least blow fuses and trip circuit breakers in protected circuits or to damage the interconnected electronics such as amplifiers and the like when too abrupt signals are received. This invention gradually delays the initial portions of the input signal of FIG. 1(a) so that an output signal B, as shown in FIG. 1(b), is passed to interconnected amplifiers and other responsive circuitry.

Figure 2:
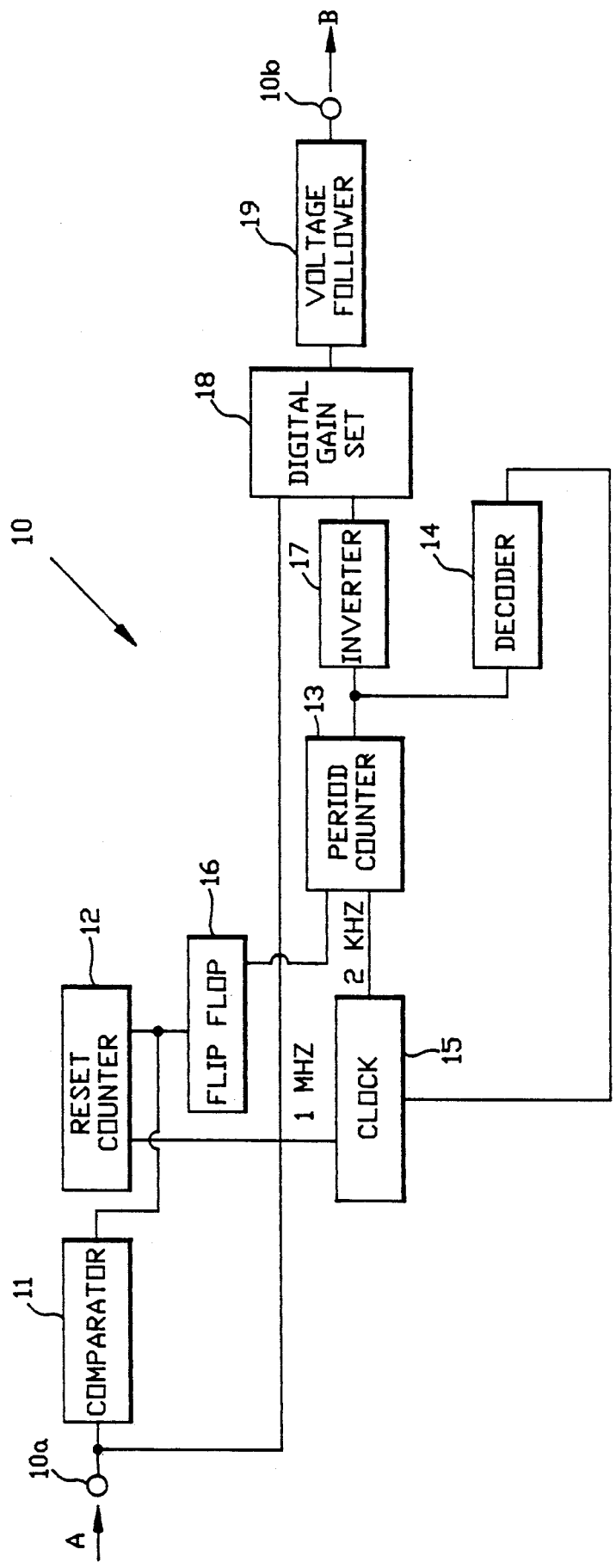
FIG. 2 is a block diagram of the principal constituents of this invention.

Referring now to FIG. 2 of the drawings, a transducer or flexducer preamplifier power controller circuit 10 has been specifically designed to prevent fuse operation and circuit breakers from tripping on start-up when an input sonar signal A such as shown in FIG. 1(a) is received at an input terminal 10a and an output signal B is created on its output terminal 10b, which is substantially as shown in FIG. 1(b). Interconnected amplifiers, both linear and switching types, require a gradual turn-on, such as that shown as -DELAY- in FIG. 1(b), rather than an abrupt full-level signal, such as that shown in FIG. 1(a). The associated interconnected components of this circuit gradually increase the input signal at input terminal 10a from zero to a maximum in approximately eight cycles at 3500 Hz at output terminal 10b. The -DELAY- created in the embodiment to be described encompasses a time interval of 2286 microseconds, and, since the circuit is crystal and digitally controlled, this delay time interval is accurate and reproduced in a series of driving sequences.

A comparator 11 is provided to establish a threshold which has been set for one half of the positive input level of input signal A, although other levels could be selected to accommodate other applications as desired. A reset counter 12, period counter 13, and decoder 14 are appropriately coupled to a clock 15 which produces 1 MHz and 2 KHz clock signals which are pre-established to be compatible for operation of the interconnected elements to provide the desired delay. A flip-flop 16 and an invertor 17 are included to assure the appropriate actuating sequence for a digital gain set circuit 18 so that its interconnected voltage follower 19 will provide output signal B at output terminal 10b.

Figure 3A:
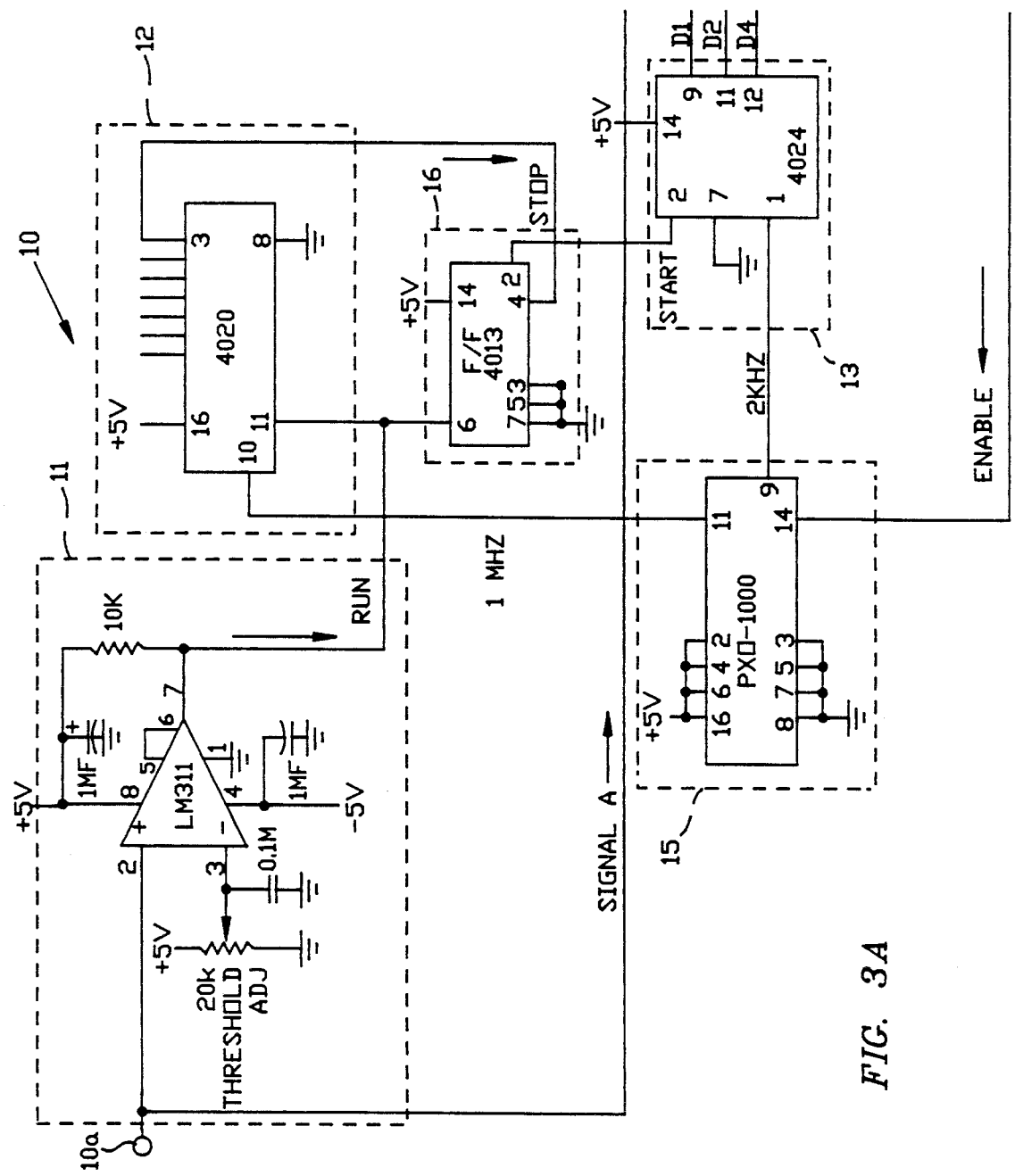
FIGS. 3A and 3B is a schematic depiction of details of the block diagram of FIG. 2.
Figure 3B:
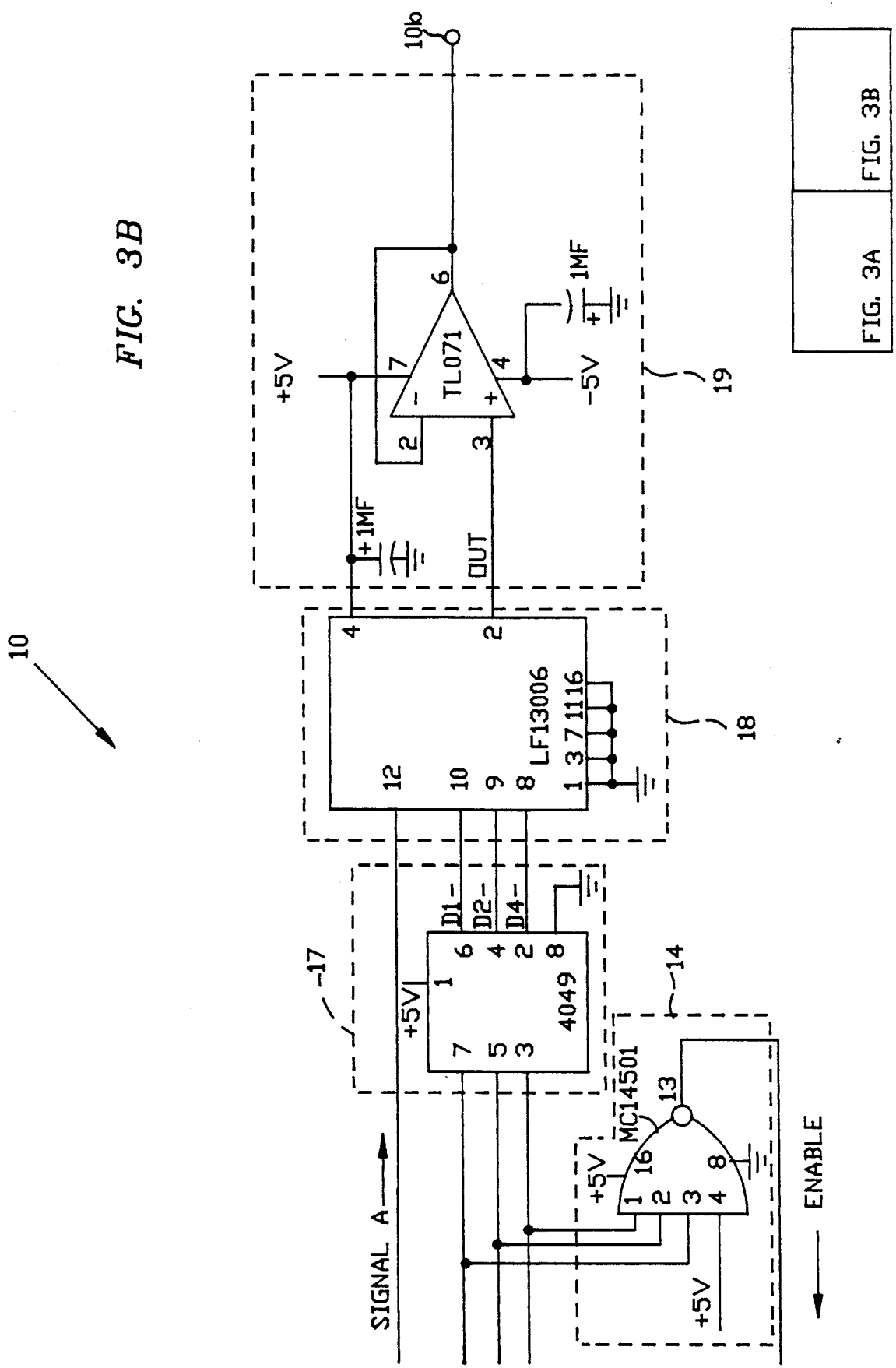

The details of power controller circuit 10 are schematically depicted in FIGS. 3A and 3B. All the complement circuits are commercially available units identified by their recognized designations in FIGS. 3A and 3B so that one skilled in the art which this invention pertains could easily fabricate and practice this inventive concept. All the circuit components are CMOS types and/or CMOS compatible voltage levels with the supply voltages ranging from +/−5 to +/−15 volts DC. Other constituent components, as well as supply voltage ranges, will suggest themselves to one versed in this particular art should a different range of input and output signals be encountered or desired.

Sonar type input signal A is connected to input terminal 10a and has a 1.0 volt RMS value. This 1-volt sinewave is equal to 2.8 volts peak to peak or a maximum positive level of 1.4 volts with a minimum negative value of 1.4 volts. Therefore, the threshold adjustment of comparator 11 is set for one half of the positive maximum or 0.7 volts, in this case. Whenever input signal A indicates that a sonar is going active, this threshold setting ensures that comparator 11 senses input signal A and provides an appropriate signal "RUN" that is interconnected to reset counter 12 and flip-flop circuit 16

Clock 16 provides two crystal controlled clock frequencies, a 1 MHz signal coupled to counter 12 and a 2 KHz signal coupled to period counter 13. The 1 MHz clock signal advances reset counter 12 only in the absence of a "RUN" signal from comparator 11. When "RUN" is absent, reset counter 12 increments until a "STOP" signal from reset counter 12 resets flip-flop 16.

When sonar signal A starts (is coupled to input terminal 10a), a "RUN" signal from comparator 11 sets flip-flop 16 and a "START" signal is fed from flip-flop 16 to period counter 13 to increment via the 2 KHz clock signals fed to it from clock 15.

Output signals D1, D2 and D4 from period counter 13 are coupled to an invertor 17 which inverts these output signals to thereby control the digital gain set of digital gain set circuit 18. In other words, the output signals from the period counter are used to control the gain of the signal input A via an "OUT" signal that gradually increases the output of an interconnected voltage follower 19 so that an output level B at terminal 10b gradually increases over the -DELAY- period to a maximum value. The rate of the gradual turn-on or increase of "OUT" is predetermined by period counter 13 and in this case has been predetermined to be eight cycles. These same eight cycles are fed to a decoder circuit 14 which decodes when eight cycles have been received, and feeds an "ENABLE" signal to clock 15 to stop it from incrementing further.

After eight cycles, output signal B at output terminal 10b remains at the same level at a maximum value until input signal A stops. When signal A stops, comparator 11 senses the absence of a signal and provides a signal "RUN" at a zero level which allows reset counter 12 to increment via the 1 MHz signal coming from clock 15. After approximately a 16 millisecond delay, a "STOP" signal from reset counter 12 resets flip-flop 16 and circuit 10 reverts to the idle mode, waiting for the next sonar signal A.

The aforedescribed circuit enables repetitive initiating input signals to activate associated interconnected amplifiers and active sonar after a minimum gradual turn-on delay. The circuitry thereby is prevented from damage and unnecessary down time due to the actuation of fuses and circuit breakers which might otherwise be initiated. Circuit applications other than the referred to sonar transducer will readily suggest themselves to one skilled in the art having the preceding disclosure in mind.

Obviously, many modifications and variations of the present invention are possible in the light of the above teachings. It is therefore to be understood that within the scope of the appended claims, the invention may be practiced otherwise than as specifically described.

I claim:

1. An apparatus for gradually increasing an actuation signal to a full level signal to prevent the creation of excessive initial signal levels comprising:

means for comparing said actuation signal with a threshold level to provide a RUN signal whenever said actuation signal is present;

means coupled to receive the RUN signal from the comparing means for generating a START signal;

means coupled to receive said START signal from the generating means for creating a predetermined amount of incrementing output signals;

means coupled to receive said actuation signal and coupled to the creating means to receive said predetermined amount of said incrementing output signals therefrom for digitally controlling the gain of said actuation signal with an OUT signal in accordance with the accumulation of said predetermined amount of said incrementing output signals to gradually increase said actuation signal to said full level signal;

means coupled to said creating means for inhibiting said creating means to provide only said predetermined amount of said incrementing output signals which correspond to the magnitude of said full level signal for the duration of said actuation signal; and means coupled to said comparing means and said generating means for resetting said generating means with a STOP signal in the absence of RUN signal from said comparing means.

2. An apparatus according to claim 1 further comprising:

means coupled to said digitally controlling gain means for amplifying said actuation signal to the magnitude of said full level signal in accordance with said OUT signal.

3. An apparatus according to claim 2 further including:

means connected to said creating means, the resetting means and the inhibiting means for providing clock signals to said creating means and said resetting means, the inhibiting means being appropriately coupled to the clock signal providing means to inhibit the coupling of clock signals to said creating means to ensure that it provides only said predetermined amount of said incrementing output signals.

4. An apparatus according to claim 3 in which said clock signal providing means provides signals at a first frequency at said resetting means and at a second frequency at said creating means.

5. An apparatus according to claim 4 further including:

means coupled to said creating means and the digitally controlling gain means for inverting said predetermined amount of said incrementing output signals before coupling them to said digitally controlling gain means.

6. A power controller circuit for gradually increasing an actuation signal to a full level signal to avoid creating excessive driving signals comprising:
   a comparator circuit adapted to compare said actuation signal with a predetermined threshold level to provide a RUN signal whenever said actuation signal is present;
   a flip-flop circuit connected to receive said RUN signal from the comparator circuit to generate a START signal;
   a period counter circuit connected to receive said START signal from the flip-flop circuit appropriately fabricated to create a predetermined amount of incrementing signals;
   a digital gain set circuit interconnected to receive said actuation signal and connected to the period counter circuit for receiving said predetermined amount of said incrementing output signals to digitally control the gain of said actuation signal with an OUT signal in accordance with the accumulation of said predetermined amount of said incrementing output signals to enable the gradual increase of said actuation signal to said full level signal;
   a decoder circuit suitably coupled to said period counter circuit for inhibiting said predetermined amount of said incrementing output signals when it corresponds to the magnitude of said full level signal throughout the duration of said actuation signal; and
   a reset counter circuit interconnected to said comparator circuit and said flip-flop circuit to reset the flip-flop circuit with a STOP signal in the absence of said RUN signal from said comparator circuit.

7. An apparatus according to claim 6 further comprising:
   a voltage follower circuit coupled to the digital gain circuit to amplify the actuation signal to the magnitude of said full level signal in accordance with said OUT signal from said digital gain set circuit.

8. An apparatus according to claim 7 further including:
   a master clock connected to said period counter circuit, said reset counter circuit and said decoder circuit, the decoder circuit being appropriately coupled to the master clock to inhibit the coupling of clock signals to the period counter circuit to ensure that the period counter circuit provides only said predetermined amount of said incrementing output signals therefrom.

9. An apparatus according to claim 8 in which the master clock provides signals at the first frequency at said reset counter circuit and at a second frequency at said period counter circuit.

10. An apparatus according to claim 9 further including an invertor circuit coupled to the period counter circuit and the digital gain set circuit to invert said predetermined amount of said incrementing output signals prior to the interconnection thereof to said digital gain set circuit.

* * * * *